(12) United States Patent
Nakatani

(10) Patent No.: US 8,975,109 B2
(45) Date of Patent: Mar. 10, 2015

(54) SOLAR BATTERY CELL AND PRODUCTION METHOD THEREOF

(75) Inventor: Mitsunori Nakatani, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 187 days.

(21) Appl. No.: 13/320,111

(22) PCT Filed: Jul. 22, 2009

(86) PCT No.: PCT/JP2009/063126
§ 371 (c)(1),
(2), (4) Date: Nov. 11, 2011

(87) PCT Pub. No.: WO2011/010373
PCT Pub. Date: Jan. 27, 2011

(65) Prior Publication Data
US 2012/0055548 A1 Mar. 8, 2012

(51) Int. Cl.
| | | |
|---|---|---|
| H01L 31/0224 | (2006.01) | |
| H01L 31/0232 | (2014.01) | |
| H01L 31/068 | (2012.01) | |
| H01L 31/18 | (2006.01) | |

(52) U.S. Cl.
CPC ...... *H01L 31/022425* (2013.01); *H01L 31/068* (2013.01); *H01L 31/1804* (2013.01); *Y02E 10/547* (2013.01)
USPC ..................................... 438/72; 257/E31.127

(58) Field of Classification Search
None
See application file for complete search history.

(56) References Cited

U.S. PATENT DOCUMENTS

| | | |
|---|---|---|
| 2001/0020486 A1 | 9/2001 | Tsuge |
| 2005/0126626 A1 | 6/2005 | Tanaka et al. |
| 2008/0000519 A1 | 1/2008 | Takahashi |

(Continued)

FOREIGN PATENT DOCUMENTS

| | | |
|---|---|---|
| EP | 1 870 942 A1 | 12/2007 |
| JP | 2-298078 A | 12/1990 |
| JP | 5-036998 A | 2/1993 |

(Continued)

OTHER PUBLICATIONS

International Search Report (PCT/ISA/210) issued on Sep. 29, 2009, by Japanese Patent Office as the International Searching Authority for International Application No. PCT/JP2009/063126.

(Continued)

*Primary Examiner* — Seahvosh Nikmanesh
(74) *Attorney, Agent, or Firm* — Buchanan Ingersoll & Rooney PC

(57) ABSTRACT

A method for producing a solar battery cell, includes: a first step of forming an insulating film on one face side of a semiconductor substrate; a second step of forming an electrode forming groove in an electrode forming region on the insulating film; a third step of printing an electrode printing paste including metal particles as a main component to a width that covers the electrode forming groove and a region sandwiching the electrode forming groove on the insulating film and that is wider than a width of the electrode forming groove, and then drying the electrode printing paste; and a fourth step of forming an electrode with the width of the electrode forming groove by firing the electrode paste at a temperature that is equal to or higher than a melting point of the metal particles or that is equal to or higher than a eutectic temperature, and accumulating and solidifying the electrode paste on the electrode forming groove.

5 Claims, 5 Drawing Sheets

(56) References Cited

U.S. PATENT DOCUMENTS

| | | | |
|---|---|---|---|
| 2008/0105297 A1* | 5/2008 | Nishida et al. | 136/256 |
| 2009/0211635 A1 | 8/2009 | Niira et al. | |

FOREIGN PATENT DOCUMENTS

| | | |
|---|---|---|
| JP | 05-036998 A | 2/1993 |
| JP | 2001-237448 A | 8/2001 |
| JP | 2007-103572 A | 4/2007 |
| JP | 2008-294209 A | 12/2008 |
| WO | WO 2006/101200 A1 | 9/2006 |
| WO | WO 2007/060743 A1 | 5/2007 |

OTHER PUBLICATIONS

Written Opinion (PCT/ISA/237) issued on Sep. 29, 2009, by Japanese Patent Office as the International Searching Authority for International Application No. PCT/JP2009/063126.

Office Action (Notice of Rejection) dated Apr. 23, 2013, issued by the Japanese Patent Office in the corresponding Japanese Patent Application No. 2011-523512, and an English translation thereof. (5 pages).

Office Action dated Dec. 11, 2012, issued by the Japanese Patent Office in the corresponding Japanese Patent Application No. 2011-523512. (3 pages).

International Preliminary Report on Patentability (Form PCT/IB/373) and the Written Opinion of the International Searching Authority (Form PCT/ISA/237) dated Mar. 13, 2012, issued in corresponding International Application No. PCT/JP2009/063126. (5 pages).

Extended European Search Report issued Dec. 2, 2013, by the European Patent Office in corresponding European Patent Application No. 09847558.5. (6 pages).

Office Action issued by the U.S. Patent and Trademark Office in the U.S. Appl. No. 14/059,945, mailed May 6, 2014, U.S. Patent and Trademark Office, Alexandria, VA. (5 pages).

Office Action issued on Mar. 10, 2014, by the Chinese Patent Office in corresponding Chinese Patent Application No. 200980159890.8 and an English translation of the Office Action. (8 pages).

Office Action issued by the U.S. Patent and Trademark Office in the U.S. Appl. No. 14/059,945, mailed Oct. 23, 2014, U.S. Patent and Trademark Office, Alexandria, VA. (7 pages).

\* cited by examiner

SOLAR BATTERY CELL AND PRODUCTION METHOD THEREOF

FIELD

The present invention relates to a solar battery cell and a production method thereof.

BACKGROUND

Conventionally, in a production process aiming to mass produce solar battery cells having silicon (Si) as a main component, typically, a paste containing metal particles is printed on a solar battery substrate by a screen printing method, and then the paste is dried and sintered to form an electrode on the solar battery substrate (see, for example, Patent Literature 1). To improve the photoelectric conversion efficiency of a light-receiving face side electrode provided on a light-receiving face (front face) of the solar battery cell, it is important to, while maintaining a low electrode resistance, reduce the electrode surface area on the light-receiving face, which is a factor in reducing the effective light-receiving surface area. More specifically, it is preferred that the light-receiving face side electrode have as high an aspect ratio (electrode thickness/electrode width) as possible while maintaining a low electrode resistance.

CITATION LIST

Patent Literature 1: Japanese Patent Application Laid-Open No. H2-298078

SUMMARY

Technical Problem

However, when a light-receiving face side electrode is formed using a normal screen printing method, the post-sintering electrode dimensions are limited to about a width of 100 μm, a thickness of 20 μm, and an aspect ratio (electrode thickness/electrode width) of 0.2. It is difficult to print so that the electrode has a thickness that is sufficient to maintain the electrode cross-sectional area, specifically, to achieve a high aspect ratio, while further reducing the electrode width.

To suppress a deterioration in properties due to carrier recombination on the back side of the solar battery cell, a lot of research is being carried out into structures in which an aluminum (Al) electrode is not allowed to be in direct contact with the silicon substrate, an insulating film is formed on the back of the silicon substrate to maintain the high-quality crystal properties of the back of the silicon substrate, and a back side electrode is provided by forming holes and grooves on the insulating film. In such a structure, how finely the holes and grooves can be formed is the key point. Similar to the formation of the above-described light-receiving face side electrode, there is a need for research into methods for producing a low-resistance printed electrode that has a high aspect ratio.

In addition, when forming a solar battery cell electrode using a screen printing method, a metal particle-containing paste is printed, dried, and then sintered. Therefore, the voids that were present among the metal particles in the paste after drying, remain after the sintering, and are ultimately still present in the electrode. If there are voids in the electrode, moisture and the like, which cause the life of the solar battery cell to deteriorate, tends to penetrate into the electrode. Consequently, in electrode formation, it is important to eliminate voids in the electrode in order to improve the durability of the solar battery cell. Moreover, voids in the electrode are also a factor in increasing the electrode resistance.

Therefore, when forming a solar battery cell electrode using a screen printing method suited to low-cost mass production, it is desirable to achieve a finer electrode by improving the aspect ratio while maintaining a low electrode resistance, and prevent a deterioration in the life of the solar battery cell by reducing the voids in the electrode.

In view of the above-described circumstances, it is an object of the present invention to obtain a solar battery cell that can be mass produced inexpensively and has excellent photoelectric conversion efficiency and durability, and a production method thereof.

Solution to Problem

In order to solve the above problem and in order to attain the above object, a method for producing a solar battery cell of the present invention, includes: a first step of forming an insulating film on one face side of a semiconductor substrate; a second step of forming an electrode forming groove in an electrode forming region on the insulating film; a third step of printing an electrode printing paste including metal particles as a main component to a width that covers the electrode forming groove and a region sandwiching the electrode forming groove on the insulating film and that is wider than a width of the electrode forming groove, and then drying the electrode printing paste; and a fourth step of forming an electrode with the width of the electrode forming groove by firing the electrode paste at a temperature that is equal to or higher than a melting point of the metal particles or that is equal to or higher than a eutectic temperature, and accumulating and solidifying the electrode paste on the electrode forming groove.

Advantageous Effects of Invention

According to the present invention, solar battery cells can be inexpensively mass produced that have a finer and thicker electrode without increasing the electrode resistance, a suppressed reduction in surface area due to the electrode, and excellent photoelectric conversion efficiency and durability, by using a conventional printing method which is low-cost and allows easy mass production.

BRIEF DESCRIPTION OF DRAWINGS

FIG. 1-2 is a top view of a solar battery cell as viewed from a light-receiving face side of the solar battery cell according to an embodiment of the present invention.

FIG. 1-3 is a bottom view of a solar battery cell as viewed from the opposite side (back side) of the light-receiving face of the solar battery cell according to an embodiment of the present invention.

FIG. 2-1 is a cross-sectional view illustrating the production steps of a solar battery cell according to an embodiment of the present invention.

FIG. 2-2 is a cross-sectional view illustrating the production steps of a solar battery cell according to an embodiment of the present invention.

FIG. 2-3 is a cross-sectional view illustrating the production steps of a solar battery cell according to an embodiment of the present invention.

FIG. 2-4 is a cross-sectional view illustrating the production steps of a solar battery cell according to an embodiment of the present invention.

FIG. 2-5 is a cross-sectional view illustrating the production steps of a solar battery cell according to an embodiment of the present invention.

FIG. 3 is a characteristic diagram illustrating the actual printing width and actual printing thickness of a post-firing grid electrode with respect to the design width when a grid electrode is formed by a conventional electrode formation method using a screen printing method.

Figure 1:
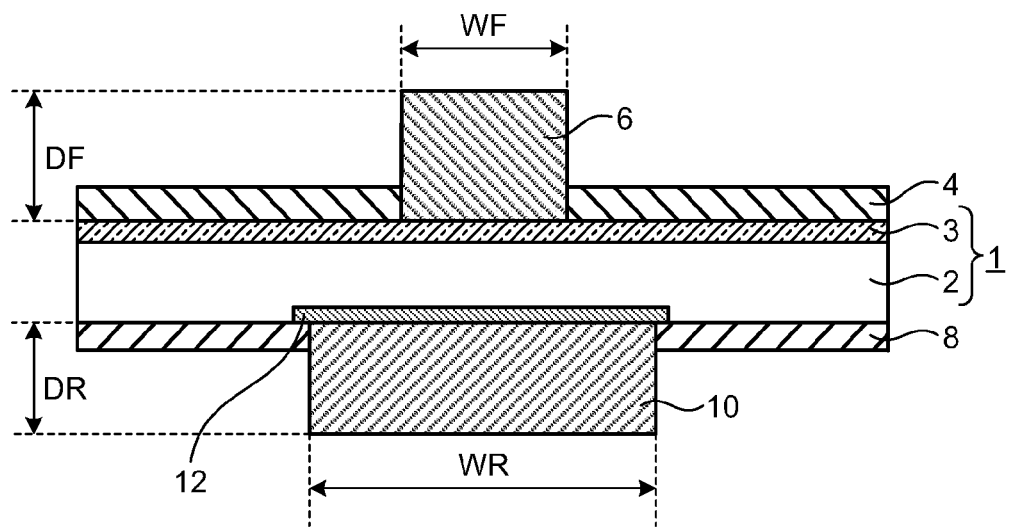
FIG. 1-1 is a cross-sectional view illustrating a main part of the cross-sectional structure of a solar battery cell according to an embodiment of the present invention.

REFERENCE SIGNS LIST 1 semiconductor substrate
2 p-type silicon substrate
3 impurity diffusion layer (n-type impurity diffusion layer)
4 anti-reflection film
5 light-receiving face side electrode
6 front grid electrode
7 front bus electrode
8 insulating film
9 back side electrode
10 back grid electrode
11 back bus electrode
13 front grid electrode forming groove
14 back grid electrode forming groove
21 front electrode printing paste
22 void among metal particles
23 back electrode printing paste
24 void among metal particles
WF front grid electrode width
WR back grid electrode width
DF front grid electrode thickness
DR back grid electrode thickness
WF1 front grid electrode forming groove width
WR1 back grid electrode forming groove width
WF' printing paste width of front grid electrode
WR' printing paste width of back grid electrode
DF' printing paste thickness of front grid electrode
DR' printing paste thickness of back grid electrode

DESCRIPTION OF EMBODIMENTS

The solar battery cell and production method thereof according to the present invention will now be described in more detail based on the drawings. However, the present invention is not limited to the following description. The present invention may be appropriately changed within the scope of what is described herein. Further, for ease of understanding, the scale of the various parts in the drawings may be different from the actual case. In addition, the scale may also vary among the drawings.

Embodiments

Figures 1, 2:
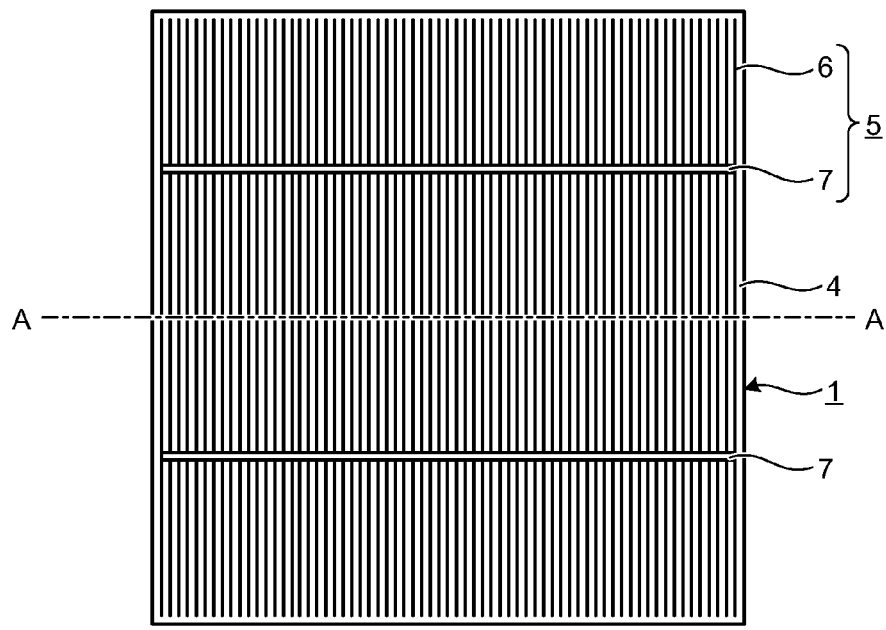
Figures 1, 2, 3:
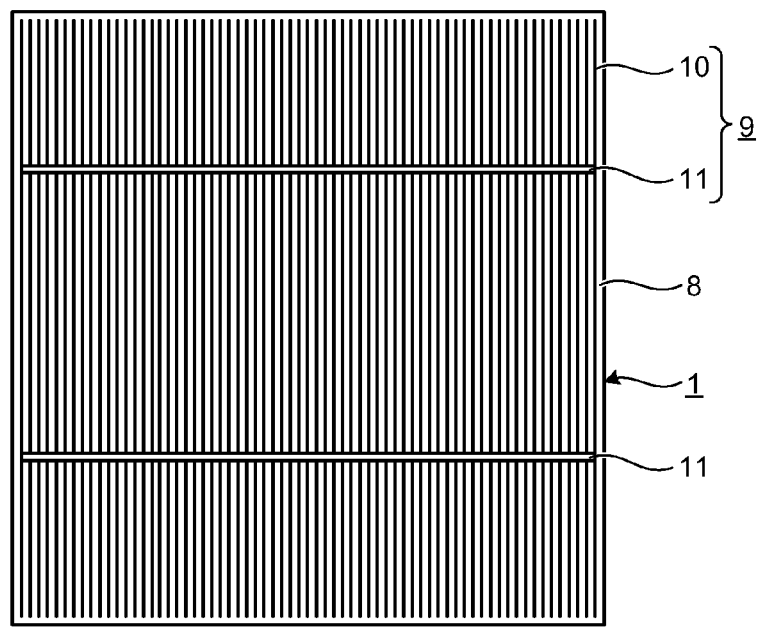

FIGS. 1-1 to 1-3 illustrate a configuration of a solar battery cell according to the present embodiment. FIG. 1-1 is a cross-sectional view illustrating a main part of the cross-sectional structure of the solar battery cell. FIG. 1-2 is a top view of the solar battery cell as viewed from a light-receiving face side. FIG. 1-3 is a bottom view of the solar battery cell as viewed from the opposite side (back side) of the light-receiving face. FIG. 1-1 is a cross-sectional view of the main part along the line A-A in FIG. 1-2.

As illustrated in FIGS. 1-1 to 1-3, the solar battery cell according to the present embodiment includes a semiconductor substrate 1 serving as a solar battery substrate that has a photoelectric conversion function and has a p-n junction; an anti-reflection film 4 formed from a silicon oxide nitride hydride film (SiONH film), which is an insulating film formed on the light-receiving face (front face) of the semiconductor substrate 1 for preventing the reflection of incident light on the light-receiving face; a light-receiving face side electrode 5 serving as a first electrode that is formed on the light-receiving face (front face) of the semiconductor substrate 1 and is surrounded by the anti-reflection film 4; an insulating film 8 formed from a silicon oxide nitride hydride film (SiONH film) formed on the face (back face) on the opposite side of the light-receiving face of the semiconductor substrate 1; and a back side electrode 9 serving as a second electrode that is formed on the back of the semiconductor substrate 1 and is surrounded by the anti-reflection film 8, the back side electrode 9 being provided to extract the electricity generated by the semiconductor substrate 1 and reflect incident light.

The p-n junction in the semiconductor substrate 1 is configured from a p-type silicon substrate 2, which is a first conductive layer, and an impurity diffusion layer (n-type impurity diffusion layer) 3, which is a second conductive layer formed by phosphorous diffusion on the light-receiving face side of the semiconductor substrate 1. The n-type impurity diffusion layer 3 has a surface sheet resistance of 30 to 100Ω/.

The anti-reflection film 4 and the insulating film 8 use a silicon oxide nitride hydride film (SiONH film) as a silicon-based insulating film that has a comparatively high melting point and does not melt at the firing temperature during electrode formation. Other than a silicon oxide nitride hydride film (SiONH film), a silicon-based insulation film such as an SiN film may also be used.

The light-receiving face side electrode 5 includes a front grid electrode 6 and a front bus electrode 7 of the solar battery cell. Further, the light-receiving face side electrode 5 is electrically connected to the n-type impurity diffusion layer 3. The front grid electrode 6 is locally provided on the light-receiving face to collect the electricity generated by the semiconductor substrate 1. The front bus electrode 7 is provided roughly orthogonal to the front grid electrode 6 in order to extract the electricity collected by the front grid electrode 6. The dimensions of the front grid electrode 6 are a front grid electrode width WF of 50 μm and a front grid electrode thickness DF of 50 μm. The aspect ratio between the front grid electrode width WF and the front grid electrode thickness DF (electrode thickness/electrode width) is 1.

The back side electrode 9 is formed in a comb shape that is approximately the same as the electrode pattern of the light-receiving face side electrode 5. The back side electrode 9 has a back grid electrode 10 and a back bus electrode 11. The dimensions of the back grid electrode 10 are a back grid electrode width WR of 500 μm and a back grid electrode thickness DR of 50 μm. The aspect ratio between the back grid electrode width WF and the back grid electrode thickness DF (electrode thickness/electrode width) is 0.1.

A p+ layer (BSF: back surface filed layer) 12, which is the same conductive high-concentration diffusion layer as the p-type silicon substrate 2, is formed in a region connected to the back side electrode 9, which is a region on the back side of the semiconductor substrate 1.

In such a configured solar battery cell, when sunlight is irradiated from the light-receiving face side of the solar battery cell on the p-n junction face (the junction face between the p-type silicon substrate 2 and the n-type impurity diffusion layer 3) of the semiconductor substrate 1, holes and electrons are generated. Due to the electrical field of the p-n junction portion, the generated electrons move toward the n-type impurity diffusion layer 3 and the holes move toward the p-type silicon substrate 2. Consequently, there are too many electrons in the n-type impurity diffusion layer 3 and too many holes in the p-type silicon substrate 2, which results in photovoltaic power being generated. This photovoltaic power is produced in a direction that biases the p-n junction in the forward direction. As a result, the light-receiving face side electrode 5 connected to the n-type impurity diffusion layer 3 becomes a minus electrode and the back side electrode 9 connected to the p-type silicon substrate 2 becomes a plus electrode, so that a current flows in a not-illustrated external circuit.

In the thus-configured solar battery cell according to the present embodiment, the front grid electrode 6 of the light-receiving face side electrode 5 can have a cross-sectional area of about 2,500 $\mu m^2$ and an aspect ratio of 1, so that a fine electrode is realized. Consequently, while maintaining the electrode cross-sectional area and a low electrode resistance, a reduction in the surface area due to the front grid electrode 6, which is a factor in reducing the effective light-receiving surface area, can be suppressed, and the photoelectric conversion efficiency can be improved.

Further, in the solar battery cell according to the present embodiment, there are no voids inside the light-receiving face side electrode 5 or the back side electrode 9. Consequently, in this solar battery cell, it is difficult for moisture or the like, which causes the life of the solar battery cell to deteriorate, to penetrate into the electrode. In addition, an increase in electrode resistance due to voids in an electrode is prevented.

Therefore, with the solar battery cell according to the present embodiment, a solar battery cell is realized that has an increased photoelectric conversion efficiency and improved durability.

Next, an example of a method for producing this solar battery cell will be described with reference to FIGS. 2-1 to 2-5. FIGS. 2-1 to 2-5 are cross-sectional views illustrating the production steps of a solar battery cell according to the present embodiment.

First, as illustrated in FIG. 2-1, for example, a p-type polycrystalline silicon substrate is prepared as the semiconductor substrate 1 (hereinafter referred to as "p-type polycrystalline silicon substrate 1"). The p-type polycrystalline silicon substrate 1 is a polycrystalline silicon substrate that contains a Group III element such as boron (B), and has an electrical resistance of about 0.5 to 3 $\Omega cm^2$. Since the p-type polycrystalline silicon substrate 1 is produced by slicing an ingot formed by cooling and solidifying molten silicon with a wire saw, it still has damage on its surface incurred during the slicing. Therefore, first, to remove this damaged layer, the surface of the p-type polycrystalline silicon substrate 1 is etched by dipping the p-type polycrystalline silicon substrate 1 in a heated alkali solution, such as an aqueous sodium hydroxide solution, whereby damaged regions near the surface of the p-type polycrystalline silicon substrate 1 that were produced when the silicon substrate was cut are removed.

Next, the p-type polycrystalline silicon substrate 1 is heated for about 10 minutes at 820° C., for example, in a phosphorous oxychloride ($POCl_3$) gas atmosphere, to form an n-type impurity diffusion layer 3 having a surface sheet resistance of 30 to 100 $\Omega$/on the surface of the p-type polycrystalline silicon substrate 1 as illustrated in FIG. 2-1, whereby a semiconductor p-n junction is formed.

Next, as illustrated in FIG. 2-2, as the anti-reflection film 4 on the surface of the p-type polycrystalline silicon substrate 1, a silicon oxide nitride hydride film (SiONH film) having a refractive index of 2.0 to 2.3 and a thickness of 650 to 900 nm is deposited at a uniform thickness by a PECVD method using oxygen gas ($O_2$), monosilane gas ($SiH_4$) and ammonia gas ($NH_3$). This anti-reflection film 4 also functions as a passivation film on the surface of the p-type polycrystalline silicon substrate 1. Further, as illustrated in FIG. 2-2, to improve the crystal properties of the back side of the p-type polycrystalline silicon substrate 1, as the insulating film 8 on the back of the p-type polycrystalline silicon substrate 1, a similar silicon oxide nitride hydride film (SiONH film) to the anti-reflection film 4 is deposited at a uniform thickness by a PECVD method using oxygen gas ($O_2$), monosilane gas ($SiH_4$) and ammonia gas ($NH_3$).

Next, as illustrated in FIG. 2-3, grooves and holes having a fine width of 70 $\mu m$ or less, for example, are formed by laser processing in the region on the anti-reflection film 4 where the light-receiving face side electrode 5 is to be formed. In the present embodiment, as the front grid electrode forming groove for forming the front grid electrode 6 among the light-receiving face side electrode forming grooves, a front grid electrode forming groove 13 having a front grid electrode forming groove width WF1 of 50 $\mu m$ is formed using laser light with a wavelength of 355 nm and a laser energy density of 3 to 10 $mJ/cm^2$ in the region on the anti-reflection film 4 where the front grid electrode 6 is to be formed.

Further, as illustrated in FIG. 2-3, grooves and holes having a fine width are formed by laser processing in the region on the insulating film 8 where the back side electrode 9 is to be formed. In the present embodiment, as the back grid electrode forming groove for forming the back grid electrode 10 among the back grid electrode forming grooves, a back side electrode forming groove 14 having a back grid electrode forming groove width WR1 of 500 $\mu m$ is formed using laser light with a wavelength of 355 nm and a laser energy density of 3 to 10 $mJ/cm^2$ in the region on the insulating film 8 where the back grid electrode 10 is to be formed.

Figures 1, 2:
Figure 2:
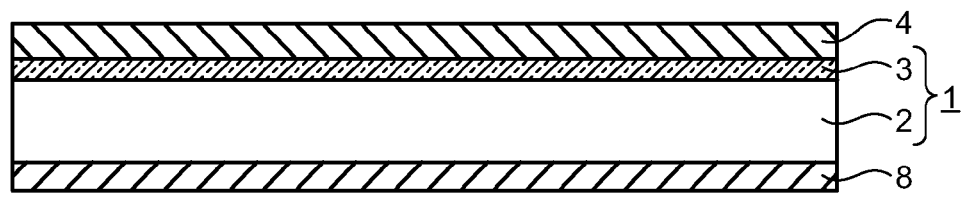
Figures 2, 3:
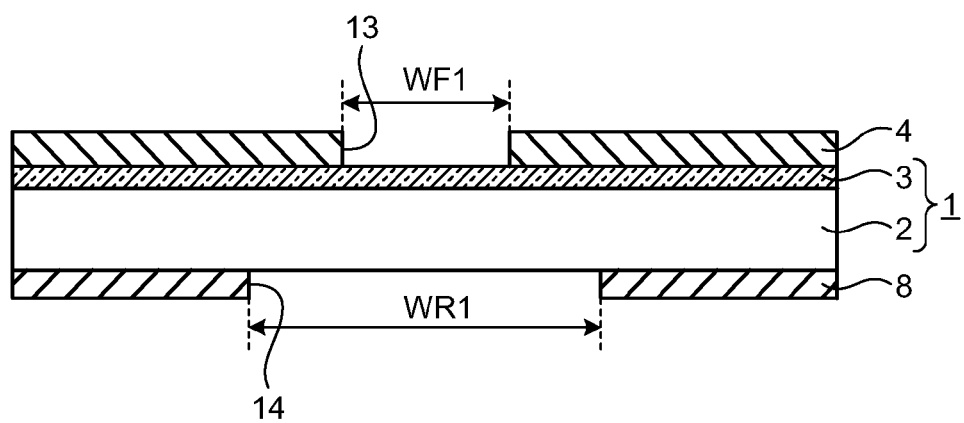
Figures 2, 3, 4:
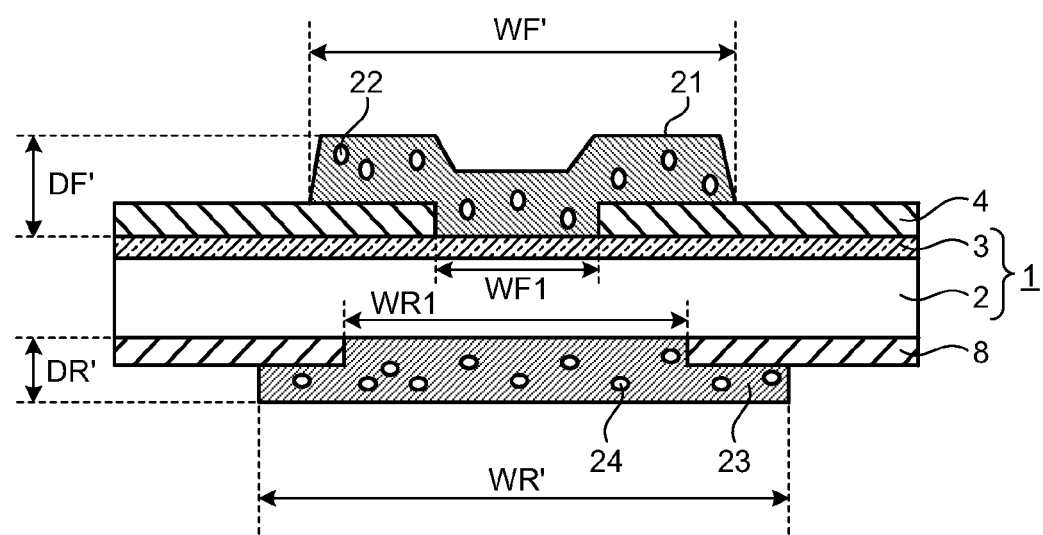
Figures 2, 3, 4, 5:
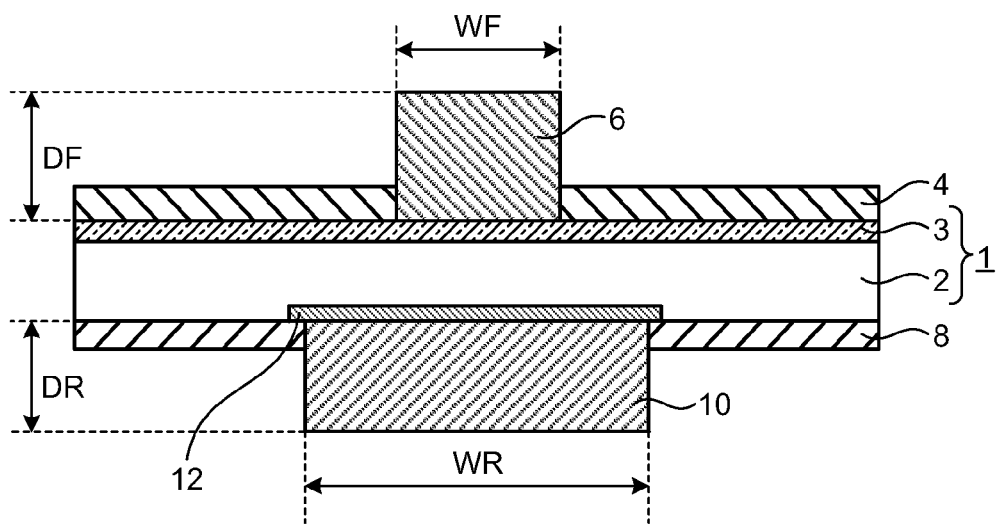
Figure 3:
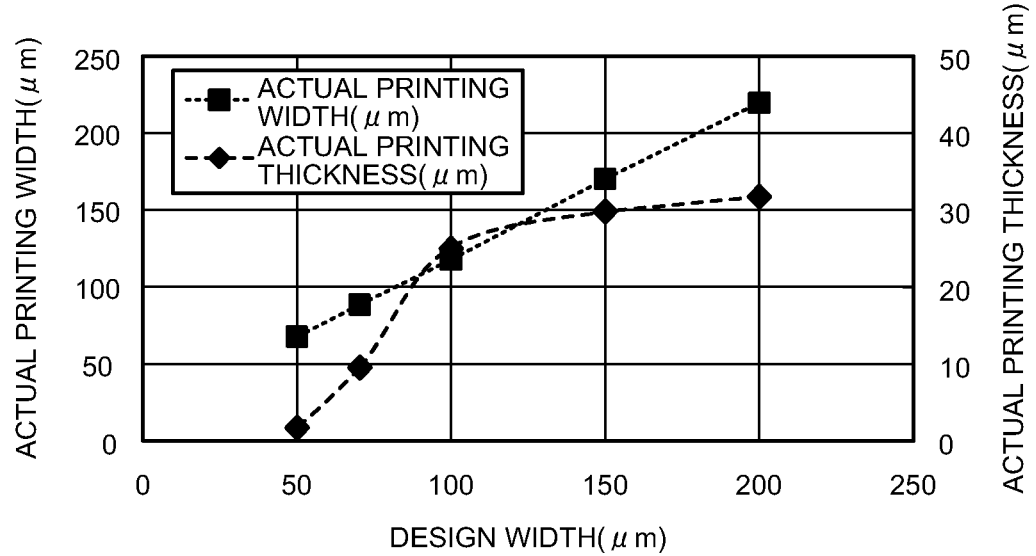

Next, on the anti-reflection film 4 that includes the light-receiving face side electrode forming grooves as illustrated in FIG. 2-4, the front grid electrode 6 and the front bus electrode 7 (pre-firing) are formed by screen printing a front electrode printing paste 21 in a pattern of the light-receiving face side electrode 5, specifically, in the patterns of the front grid electrode 6 and front bus electrode 7, and then drying the front electrode printing paste 21. Here, in the region where the front grid electrode 6 is to be formed, the front electrode printing paste 21 is printed to a width that covers the front grid electrode forming groove 13 and a region sandwiching this groove on the anti-reflection film 4, and that is wider than the width of the front grid electrode forming groove 13, so that a printing paste width WF' of the front grid electrode is 100 $\mu m$ or more and is wider than a width WF1 of the front grid electrode forming groove. In the present embodiment, the front grid electrode printing paste 21 is screen printed so that the front grid electrode printing paste width WF' is 100 $\mu m$.

Next, on the insulating film 8 that includes the back side electrode forming grooves as illustrated in FIG. 2-4, the back grid electrode 10 and back bus electrode 11 (pre-firing) are formed by screen printing a back electrode printing paste 23 in a pattern of the back side electrode 9, specifically, in the patterns of the back grid electrode 10 and back bus electrode 11, and then drying the back electrode printing paste 23. Here, in the region where the back grid electrode 10 is to be formed, the back electrode printing paste 23 is printed to a width that covers the back grid electrode forming groove 14 and a region sandwiching this groove on the insulating film 8, and that is wider than the width of the back grid electrode forming groove 14, so that a printing paste width WR' of the back grid electrode is 500 μm or more and is wider than a width WR1 of the back grid electrode forming groove. In the present embodiment, the back grid electrode printing paste 23 is screen printed so that the back grid electrode printing paste width WR' is 900 μm.

The components of the paste used in the electrode printing will now be described. The front electrode printing paste 21 for the front grid electrode 6 includes, for example, an ethyl cellulose or thinner solvent for ensuring the printing properties, metal particles of one or a plurality of components selected from silver (Ag), copper (Cu), gold (Au), platinum (Pt), lead (Pd), and aluminum (Al), or an alloy of these components, and one or a plurality of components selected from zinc oxide (ZnO), lead oxide (PbO), silicon monooxide (SiO), and bismuth oxide (BiO), which is a glass component having a lower melting point than silver (Ag) used as a reaction promoter during the firing of the p-type polycrystalline silicon substrate 1 with the metal particles. The above-described metals can be inexpensively obtained, and are highly reliable as electrode components for solar battery cells.

For example, for a printing paste that includes 80 wt % of silver (Ag, melting point of 962° C.) as a main component of the printing paste and 0.1 wt % of lead monooxide (PbO), a metal and silicon reaction layer can be obtained at a depth of 0.01 to 0.1 μm at the interface between the n-type impurity diffusion layer 3 and the light-receiving face side electrode 5 by heating with an infrared heater for 3 seconds at 1,000° C., so that a sufficiently low contact resistance between the light-receiving face side electrode 5 and the n-type impurity diffusion layer 3 can be obtained.

Similar to the front grid electrode 6, for the back side electrode 9 too, a sufficiently low contact resistance between the back side electrode 9 and the p-type silicon substrate 2 can be obtained by using a printing paste that includes 70 wt % of aluminum (Al) particles as a main component of the printing paste. In addition, since a p+ layer (BSF layer) 12 more highly doped than the p-type polycrystalline silicon substrate 1 can be formed, the recombination rate of the photogenerated carriers can be suppressed by a BSF effect, and the solar battery cell conversion efficiency can be increased.

Next, the p-type polycrystalline silicon substrate 1 is fired at a temperature that is equal to or higher than the melting point of the metal particles, which are the main component of the front electrode printing paste 21 and the back electrode printing paste 23, or that is equal to or higher than the eutectic temperature. When a plurality of types of metal particles are included, the highest melting point or eutectic temperature is used as a standard. The anti-reflection film 4, which is an insulating film, and the insulating film 8 do not have good wettability with the molten metal. Therefore, the front electrode printing paste 21 and back electrode printing paste 23 in which the metal particles are melted accumulate toward the light-receiving face side electrode forming groove or the back side electrode forming groove where the insulating film 8 is not present, without remaining on the anti-reflection film 4 or the insulating film 8, and then solidify. Further, since a silicon oxide nitride hydride film (SiONH film), which is a silicon insulating film having a comparatively high melting point, is used so that the film does not melt at the firing temperature during electrode formation, the anti-reflection film 4 and the insulating film 8 do not melt during firing.

During the solidification of the metal, which is the main component of the front electrode printing paste 21 and the back electrode printing paste 23, the printing paste width WF' of the front grid electrode and the printing paste width WR' of the back grid electrode contract to the electrode width WF and the electrode width WR, respectively. On the other hand, the printing paste thickness DF' of the front grid electrode and the printing paste thickness DR' of the back grid electrode increase to the electrode thickness DF and the electrode thickness DR, respectively. This happens because of the poor wettability between the insulating film and the molten metal, so that the front electrode printing paste 21 and the back electrode printing paste 23 in which the metal particles have melted accumulate on the light-receiving face side electrode forming groove or back side electrode forming groove where there is no insulating film 8. Consequently, although the accumulated molten metal solidifies at a width that is narrower than the printed width, the cross-sectional area of the electrode is nearly maintained.

Then, the front grid electrode 6 (post-firing) is formed in a state in which the cross-sectional area has nearly been maintained from when the front electrode printing paste 21 was printed. As illustrated in FIG. 2-5, the front grid electrode 6 (post-firing) is obtained having the same electrode width as the width WF1 of the front grid electrode forming groove, with a greater fineness and thickness. Similarly, the back grid electrode 10 (post-firing) is formed in a state in which the cross-sectional area has nearly been maintained from when the back electrode printing paste 23 was printed. As illustrated in FIG. 2-5, the back grid electrode 10 (post-firing) is obtained having the same electrode width as the width WR1 of the back grid electrode forming groove, with a greater fineness and thickness.

As specific dimensions, for example, if the front grid electrode forming groove width WF1 is 50 μm, the front grid electrode printing paste width WF' is 120 μm, and the front grid electrode printing paste thickness DF' is 25 μm, after the firing a front grid electrode 6 is obtained that has an electrode width WF of 50 μm, an electrode thickness DF of 50 μm, and an aspect ratio (electrode thickness/electrode width) of 1. Further, if the back grid electrode forming groove width WR1 is 500 μm, the back grid electrode printing paste width WR' is 900 μm, and the back grid electrode printing paste thickness DR' is 30 μm, after the firing a back grid electrode 10 is obtained that has an electrode width WR of 500 μm, an electrode thickness DR of 50 μm, and an aspect ratio (electrode thickness/electrode width) of 0.1.

The printed and dried front electrode printing paste 21 includes a large amount of voids 22 among the metal particles due to the mesh of the mask that is used in the screen printing. Similarly, the printed and dried back electrode printing paste 23 includes a large amount of voids 24 among the metal particles due to the mesh of the mask that is used in the screen printing. However, if the melt time of the metal in the printing paste is sufficiently long, the voids among the metal particles that were present after the printing and drying disappear. More specifically, if the firing is carried out for a sufficient time at a temperature equal to or higher than the melting point of the metal, which is the main component of the front electrode printing paste 21 and the back electrode printing paste 23, or that is equal to or higher than the eutectic temperature, the voids 22 and 24 among the metal particles disappear, so that a void-free light-receiving face side electrode 5 and back side electrode 9 are obtained. Since moisture and the like which cause the life of a solar battery cell to deteriorate does not easily penetrate into electrodes that do not have any voids, the moisture resistance of the solar battery cell is greatly improved, and the life of the solar battery cell can be made much longer. Further, the increase in electrode resistance due to voids in the electrode can be prevented, so that a low-resistance electrode can be realized.

As described above, a glass component formed from an oxide of zinc (Zn), lead (Pb), silicon (Si), bismuth (Bi) or the like is included in the printing paste to obtain an effect that lowers the contact resistance between the metal and the silicon substrate. However, the insulating film formed from silicon (Si), nitrogen (N), oxygen (O), hydrogen (H) and the like can melt in the glass component, thereby destroying the structure of the light-receiving face side electrode forming groove or back side electrode forming groove. Consequently, it is preferred that the content of these glass components in the printing paste be as small as possible. In the present embodiment, since the printing paste is sintered by increasing the temperature to or higher than the melting point of the metal particles or to or higher than the eutectic temperature, a sufficiently low contact resistance can be obtained due to the formation of a reaction layer between the metal and silicon at the interface between the silicon in the p-type polycrystalline silicon substrate 1 and the metal particles, even if the content of these glass components is very small or none.

FIG. 3 is a characteristic diagram illustrating the actual printing width (µm) and thickness (µm) of a post-firing grid electrode with respect to the design width when a grid electrode is formed by a conventional method for forming electrodes using a screen printing method. Here, the thickness of the screen printing mask is fixed. As can be seen from FIG. 3, if the design width is 100 µm, the actual printing width of the grid electrode is 120 µm, the actual printing thickness is 25 µm, and the aspect ratio (electrode thickness/electrode width) is 0.2. Further, it can also be seen from FIG. 3 that the actual printing width becomes thicker in proportion to the design width. On the other hand, even if the design width is less than 100 µm, the actual printing width dramatically decreases due to it being more difficult to push the printing paste out from the screen printing mask as a result of the viscosity of the printing paste. Further, the actual printing width tends not to change much even if the design width is more than 100µ. Therefore, it is difficult to form a grid electrode having a desired aspect ratio by a conventional method for forming electrodes using a screen printing method. It is especially difficult to form a grid electrode having a high aspect ratio. In the example illustrated in FIG. 3, when the design width is set to a value other than 100 µm, it was difficult to form a grid electrode having an aspect ratio higher than 0.2.

In contrast, with the solar battery cell production method according to the present embodiment described above, a front grid electrode 6 can be formed that has a post-firing electrode width WF of 50 µm, electrode thickness DF of 50 µm, and aspect ratio (electrode thickness/electrode width) of 1, so that a grid electrode having a high aspect ratio can be formed when the design width is set to a value other than 100 µm.

As described above, according to the solar battery cell production method according to the present embodiment, a finer, thicker front grid electrode 6 can be formed in which the electrode width is narrower and the electrode is thicker than when the printing paste was printed. Consequently, while maintaining the electrode cross-sectional area and a low electrode resistance, a reduction in the surface area, which is a factor in reducing the effective light-receiving surface area, can be suppressed, and the photoelectric conversion efficiency can be improved.

Further, according to the solar battery cell production method according to the present embodiment, there are no voids inside the electrode. Consequently, it is difficult for moisture or the like, which causes the life of the solar battery cell to deteriorate, to penetrate into the electrode. In addition, an increase in electrode resistance due to voids in the electrode is prevented.

Further, since the width of a grid electrode formed by conventional printing technology is 100 µm or more, the loss in the light-receiving surface area of a solar battery cell that is unable to generate power due to blockage by the grid electrode is 3% or more. However, with the solar battery cell production method according to the present embodiment, since a low-resistance grid electrode can be formed having a grid electrode width of 50 µm or less and an aspect ratio of 0.8 or more, the photoelectric conversion efficiency of the solar battery cell can be relatively improved by 2% or more.

Therefore, with the solar battery cell production method according to the present embodiment, solar battery cells having greater photoelectric conversion efficiency and improved durability can be mass produced inexpensively.

The invention claimed is:

1. A method for producing a solar battery cell, characterized by comprising:
   a first step of forming an insulating film on one face side of a semiconductor substrate;
   a second step of forming a groove in the insulating film for forming an electrode forming region;
   a third step of printing an electrode printing paste including metal particles as a main component to a width that covers the electrode forming region groove and a region sandwiching the electrode forming region groove in the insulating film and that is wider than a width of the electrode forming region groove, and then drying the electrode printing paste; and
   a fourth step of forming an electrode with the width of the electrode forming region groove by firing the electrode paste at a temperature that is equal to or higher than a melting point of the metal particles or that is equal to or higher than a eutectic temperature, and accumulating and solidifying the electrode paste on the electrode forming region groove.

2. The method for producing the solar battery cell according to claim 1, wherein there are no voids in the electrode.

3. The method for producing the solar battery cell according to claim 1, wherein the semiconductor substrate is a silicon substrate, and the electrode printing paste includes metal particles of one or a plurality of components selected from silver, copper, gold, platinum, lead, and aluminum, or an alloy of these components.

4. The method for producing the solar battery cell according to claim 1, wherein the insulating film is a silicon insulating film.

5. The method for producing the solar battery cell according to claim 1, wherein the electrode is a light-receiving face side electrode, and the insulating film is an anti-reflection film.

* * * * *